(12) United States Patent
Ma et al.

(10) Patent No.: US 11,659,729 B2
(45) Date of Patent: May 23, 2023

(54) ELECTRONIC DEVICE SUBSTRATE, MANUFACTURING METHOD AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Qun Ma, Beijing (CN); Zhiming Cui, Beijing (CN); Dawei Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 714 days.

(21) Appl. No.: 16/336,715

(22) PCT Filed: Sep. 6, 2018

(86) PCT No.: PCT/CN2018/104335
§ 371 (c)(1),
(2) Date: Mar. 26, 2019

(87) PCT Pub. No.: WO2019/109692
PCT Pub. Date: Jun. 13, 2019

(65) Prior Publication Data
US 2021/0367198 A1    Nov. 25, 2021

(30) Foreign Application Priority Data
Dec. 7, 2017   (CN) .......................... 201711284358.1

(51) Int. Cl.
*H01L 51/52*    (2006.01)

(52) U.S. Cl.
CPC ........... *H10K 50/844* (2023.02); *H10K 71/00* (2023.02); *H10K 71/70* (2023.02)

(58) Field of Classification Search
IPC .................................................... H01L 51/5246
See application file for complete search history.

(56) References Cited

U.S. PATENT DOCUMENTS

2015/0060806 A1    3/2015  Park et al.
2015/0380685 A1*   12/2015 Lee ..................... H01L 51/5243
                                                                257/40
(Continued)

FOREIGN PATENT DOCUMENTS

CN    104425760 A    3/2015
CN    104900681 A    9/2015
(Continued)

OTHER PUBLICATIONS

International Search Report and Written Opinon dated Dec. 14, 2018 from State Intellectual Property Office of P.R. China.
(Continued)

*Primary Examiner* — Benjamin P Sandvik
(74) *Attorney, Agent, or Firm* — Dilworth & Barrese, LLP.; Michael J. Musella, Esq.

(57) ABSTRACT

An electronic device substrate, a manufacturing method and a display device are provided. The electronic device substrate includes a base substrate, an organic encapsulation layer and a padding structure. The organic encapsulation layer is on the base substrate and includes a main part and an edge part; the padding structure on the base substrate protrudes from the base substrate; the edge part of the organic encapsulation layer at least partially covers the padding structure; with respect to the base substrate, a height of a part that is included by the padding structure and is away from the main part of the organic encapsulation layer is greater than a height of another part that is included by the (Continued)

padding structure and is close to the main part of the organic encapsulation layer.

12 Claims, 4 Drawing Sheets

(56) References Cited

U.S. PATENT DOCUMENTS

| | | | |
|---|---|---|---|
| 2016/0365395 A1 | 12/2016 | Xu et al. | |
| 2018/0061910 A1 | 3/2018 | Cai | |
| 2018/0102502 A1* | 4/2018 | Kim | H01L 51/5256 |
| 2018/0366520 A1* | 12/2018 | Gwon | H01L 27/3246 |
| 2019/0363275 A1* | 11/2019 | Ochi | H01L 51/5246 |
| 2021/0336212 A1* | 10/2021 | Long | H01L 27/3246 |

FOREIGN PATENT DOCUMENTS

| | | | |
|---|---|---|---|
| CN | 105280677 A | 1/2016 |
| CN | 105914224 A | 8/2016 |
| CN | 106953029 A | 7/2017 |
| CN | 107068715 A | 8/2017 |
| CN | 107170792 A | 9/2017 |
| EP | 2960962 A1 | 12/2015 |

OTHER PUBLICATIONS

Extended European Search Report from Application No. 18857408.1 dated Jul. 21, 2021.

* cited by examiner

ELECTRONIC DEVICE SUBSTRATE, MANUFACTURING METHOD AND DISPLAY DEVICE

CROSS-REFERENCE TO RELATED APPLICATIONS

This application claims the benefit of Chinese patent application No. 201711284358.1 filed on Dec. 7, 2017, which is hereby entirely incorporated by reference as a part of the present application.

TECHNICAL FIELD

Embodiments of the present disclosure relate to an electronic device substrate, a manufacturing method and a display device.

BACKGROUND

For example, displays, diodes, micro-electro-mechanical system sensors and the like all require fully sealed physical encapsulation for protection. For example, light-emitter elements of organic light-emitting diode (OLED) displays are sensitive to water vapor, oxygen and the like in the air, and the water vapor and oxygen will affect the performances such as the service life and the efficiency of the light-emitter elements. Thus, in order to prevent excessive aging and instability of the OLED displays, the light-emitter elements need to be encapsulated.

The thin-film encapsulation is one of the commonly used encapsulation methods in the OLED displays. The thin-film encapsulation, for instance, may adopt an encapsulation manner in which inorganic material layers and organic material layers are alternately stacked. The inkjet printing process has become one of the commonly used processes for manufacturing the OLED displays due to the advantages such as rapid deposition speed, good uniformity and low equipment investment. In the process of forming an organic encapsulation layer by the inkjet printing process, a barrier wall is usually provided on a base substrate at a position corresponding to an ink print boundary.

SUMMARY

At least one embodiment of the present disclosure provides an electronic device substrate, which includes a base substrate, an organic encapsulation layer and a padding structure. The organic encapsulation layer is on the base substrate and includes a main part and an edge part; the padding structure is provided on the base substrate and protrudes from the base substrate; the edge part of the organic encapsulation layer at least partially covers the padding structure; and a part that is included by the padding structure and is away from the main part of the organic encapsulation layer has a height with respect to the base substrate greater than a height of another part that is included by the padding structure and is close to the main part of the organic encapsulation layer with respect to the base substrate.

For example, in the electronic device substrate provided by one embodiment of the present disclosure, the electronic device structure includes an operation region and a non-operation region; the main part of the organic encapsulation layer is in the operation region; and the edge part of the organic encapsulation layer is in the non-operation region.

For example, in the electronic device substrate provided by one embodiment of the present disclosure, in a direction perpendicular to the base substrate, a thickness of the edge part of the organic encapsulation layer is less than a thickness of the main part of the organic encapsulation layer.

For example, in the electronic device substrate provided by one embodiment of the present disclosure, in a direction perpendicular to the base substrate and in an arrangement direction from the operation region to the non-operation region, a sectional structure of the padding structure includes a wedge or step structure; as a part of the wedge or step structure is closer to the organic encapsulation layer, a height of the part of the wedge or step structure is smaller.

For example, in the electronic device substrate provided by one embodiment of the present disclosure, the sectional structure of the padding structure is the wedge, a slope angle of an inclined surface of a wedge part of the padding structure is equal to an included angle between an upper surface of the edge part of the organic encapsulation layer and a material that is on the base substrate and supports a lower surface of the edge part of the organic encapsulation layer.

For example, in the electronic device substrate provided by one embodiment of the present disclosure, the sectional structure of the padding structure is the wedge, an inclined surface of a wedge part of the padding structure is parallel to a surface that is included by the edge part of the organic encapsulation layer and faces the base substrate.

For example, in the electronic device substrate provided by one embodiment of the present disclosure, the padding structure further includes another inclined surface inclined with respect to the base substrate; the another inclined surface has an inclination direction opposite to an inclination direction of the inclined surface of the wedge part; and an inclination degree of the another inclined surface is greater than an inclination degree of the inclined surface of the wedge part.

For example, in the electronic device substrate provided by one embodiment of the present disclosure, the padding structure further includes a flat part; a surface that is included by the flat part and is away from the base substrate is parallel to the base substrate; and the flat part is on a side of the wedge part away from the organic encapsulation layer.

For example, in the electronic device substrate provided by one embodiment of the present disclosure, the padding structure includes a first padding structure and a second padding structure which is closer to the organic encapsulation layer than the first padding structure; an interval is between the first padding structure and the second padding structure; and a height of a top of the first padding structure with respect to the base substrate is greater than a height of a top of the second padding structure with respect to the base substrate.

For example, in the electronic device substrate provided by one embodiment of the present disclosure, the edge part of the organic encapsulation layer covers the second padding structure and at least a part of the first padding structure.

For example, the electronic device substrate provided by one embodiment of the present disclosure further includes a barrier wall, the barrier wall is on the base substrate and on a side of the padding structure close to an edge of the base substrate, and an interval is between the barrier wall and the padding structure.

For example, the electronic device substrate provided by one embodiment of the present disclosure further includes a first encapsulation layer, and the first encapsulation layer is between the organic encapsulation layer and the base substrate and covers the padding structure.

For example, the electronic device substrate provided by one embodiment of the present disclosure further includes a second encapsulation layer, and the second encapsulation layer is on the organic encapsulation layer and covers the padding structure.

For example, in the electronic device substrate provided by one embodiment of the present disclosure, each of the first encapsulation layer and the second encapsulation layer is an inorganic material layer.

For example, in the electronic device substrate provided by one embodiment of the present disclosure, the padding structure is in direct contact with the edge part.

At least one embodiment of the present disclosure provides a display device including the electronic device substrate in any one of the embodiments of the present disclosure.

At least one embodiment of the present disclosure provides a manufacturing method of an electronic device substrate, which includes: providing a base substrate; forming a padding structure on the base substrate, wherein the padding structure is on the base substrate and protrudes from the base substrate; and forming an organic encapsulation layer on the base substrate, wherein the organic encapsulation layer includes an edge part and a main part, wherein the edge part of the organic encapsulation layer at least partially covers the padding structure; and with respect to the base substrate, a part that is included by the padding structure and is away from the main part of the organic encapsulation layer has a height greater than a height of another part that is included by the padding structure and is close to the main part of the organic encapsulation layer.

For example, in the method provided by one embodiment of the present disclosure, in a direction perpendicular to the base substrate and in an arrangement direction from an operation region to a non-operation region, a sectional structure of the padding structure includes a wedge or step structure; as a part of the wedge or step structure is closer to the organic encapsulation layer, a height of the part of the wedge or step structure is smaller.

For example, in the method provided by one embodiment of the present disclosure, the sectional structure of the padding structure is the wedge, a slope angle of an inclined surface of a wedge part of the padding structure is equal to an included angle formed between an upper surface of the edge part of the organic encapsulation layer and a material that is on the base substrate and supports a lower surface of the edge part of the organic encapsulation layer.

For example, in the method provided by one embodiment of the present disclosure, the padding structure includes a first padding structure and a second padding structure that is closer to the organic encapsulation layer than the first padding structure; an interval is between the first padding structure and the second padding structure; and a height of a top of the first padding structure with respect to the base substrate is greater than a height of a top of the second padding structure with respect to the base substrate.

For example, the method provided by one embodiment of the present disclosure further includes: forming an organic encapsulation test layer on the base substrate before forming the padding structure, so that the organic encapsulation test layer includes a main part and an edge part, the main part of the organic encapsulation test layer is in a region where the main part of the organic encapsulation layer to be formed is located, the edge part of the organic encapsulation test layer is in a region where the edge part of the organic encapsulation layer to be formed is located; measuring an included angle formed between surfaces of the edge part of the organic encapsulation test layer; and removing the organic encapsulation test layer. In the method, the padding structure is formed according to the included angle formed by the edge part of the organic encapsulation test layer.

For example, in the method provided by one embodiment of the present disclosure, the organic encapsulation layer is formed by an inkjet printing process.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
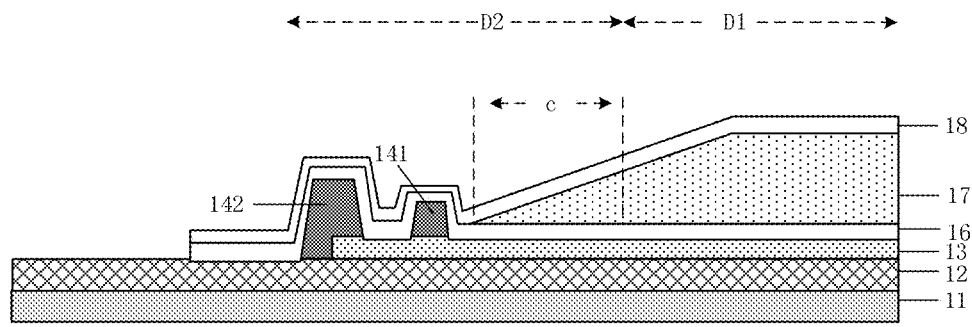
FIG. 1 is a schematic structural sectional view of a display substrate.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the manufacturing process of a display substrate, e.g., an organic light-emitting diode display substrate, in order to prevent external water vapor, oxygen and the like from eroding, for instance, light-emitter elements of the display substrate, a thin-film encapsulation method is generally adopted to encapsulate the light-emitter elements of the display substrate. A thin-film encapsulation structure, for instance, generally includes a laminated structure formed by organic thin-film layers and inorganic thin-film layers which are alternately stacked. The forming methods of the organic thin-film layer may include flash evaporation, screen printing, inkjet printing, etc. The inkjet printing method has become one of the commonly used technologies for forming the organic thin-film layers due to its advantages such as rapid deposition speed, good uniformity and low equipment investment. In the process of forming the organic thin-film layer by the inkjet printing method, in order to print an ink material for forming the organic thin-film layer in a designated region and prevent the ink material from overflowing a boundary of the designated region, a barrier wall is usually provided on a base substrate at a position corresponding to an ink print boundary.

FIG. 1 is a schematic structural sectional view of a display substrate. As shown in the figure, the display substrate includes a base substrate 11, a buffer layer 12, a back panel 13, a first barrier wall 141, a second barrier wall 142, a first encapsulation layer 16, an organic encapsulation layer 17 and a second encapsulation layer 18, and the first barrier wall 141 is provided on the inside of the second barrier wall 142.

The display substrate may be in various shapes such as rectangle and includes a display region D1 provided in the middle and a non-display region D2 provided at the periphery of the display region. As shown in FIG. 1, the first barrier wall 141 and the second barrier wall 142 are provided in the non-display region D2 of the display substrate. For instance, a closed frame structure is formed at an edge of the display substrate. The organic encapsulation layer 17 is provided in the display region D1 of the display substrate and extends into the non-display region D2. The organic encapsulation layer 17 is formed by the inkjet printing process. The first barrier wall 141 and the second barrier wall 142 are used for defining a print region of the ink material.

In the above display substrate, when an inkjet printer prints the ink material in the designated region, because the ink material has certain fluidity, a part of the ink material flows from the display region D1 to a position close to the first barrier wall 141 in the non-display region D2, so as to form a slope in a boundary region c that is in the non-display region D2 and is close to the display region D1, so that the thickness of the organic encapsulation layer 17 formed in the non-display region D2 is less than the thickness of the organic encapsulation layer 17 formed in the display region D1. As for the structure shown in FIG. 1, when the difference between the thickness of the organic encapsulation layer 17 in the display region D1 and the thickness of the organic encapsulation layer 17 in the non-display region D2 is large, due to the action of gravity, as a part of the ink material in the display region D1 is closer to the non-display region D2, the part of the ink material more tend to flow outwards, so the large thickness difference may affect the optical long-range uniformity of the display substrate formed by the organic encapsulation layer 17 and then reduce the optical display effect of the display substrate.

At least one embodiment of the present disclosure provides an electronic device substrate, which includes a base substrate, an organic encapsulation layer and a padding structure. The organic encapsulation layer is provided on the base substrate and includes a main part and an edge part; the padding structure is provided on the base substrate and protrudes from the base substrate; the edge part of the organic encapsulation layer at least partially covers the padding structure; and with respect to the base substrate, a height of a part that is included by the padding structure and is away from the main part of the organic encapsulation layer is greater than a height of another part that is included by the padding structure and is close to the main part of the organic encapsulation layer.

In the electronic device substrate provided by the above embodiment, on one hand, by providing the padding structure which is provided on and protrudes from the base substrate, the print region of the ink material can be defined to a certain degree; and on the other hand, because the padding structure is at least partially provided below the edge part of the organic encapsulation layer, in an direction perpendicular to the base substrate, a difference between heights of a surface of the edge part of the organic encapsulation layer and a surface of the main part of the organic encapsulation layer with respect to the base substrate can be reduced, the thickness uniformity of the organic encapsulation layer on a plane where the base substrate of the electronic device substrate is located can be improved, thus improving the optical long-range uniformity of the electronic device substrate and improving the luminous effect of the electronic device substrate.

The electronic device substrate can be applied to electronic devices such as display devices and light-emitting devices (namely the electronic device substrate is a display substrate, or a light-emitting substrate, etc.) for many applications such as display, lighting and billboard. For instance, the electronic device substrate includes an operation region and a non-operation region provided at a periphery of the operation region. For instance, functional elements arranged in multiple rows and multiple columns are arranged in the operation region, and the operation region includes regions where the functional elements are located and regions between adjacent functional elements. For instance, the electronic device substrate is a display substrate; correspondingly, the operation region of the electronic device substrate is a display region and the non-operation region is a non-display region, and the above functional elements are subpixel units. For instance, the electronic device substrate is a light-emitting substrate, the operation region thereof is a luminous region, the non-operation region thereof is a non-luminous region provided at the periphery of the luminous region, and the above functional elements are sub-light-emitter units. The examples of the electronic device substrate provided by the embodiments of the present disclosure include but is not limited to the display substrate and the light-emitting substrate.

Description will be given below with reference to several specific embodiments. In order to clearly and simply illustrate the embodiments of the present disclosure, the detailed description on known functions and known components may be omitted. When any component in the embodiments of the present disclosure appears in more than one drawings, the component is represented by the same reference sign in each drawing.

At least one embodiment of the present disclosure provides the electronic device substrate (for instance, a display substrate) 100. As shown in FIG. 2A to FIG. 3D, the electronic device substrate 100 includes the base substrate 101, the organic encapsulation layer 107 and the padding structure 105. The electronic device substrate 100 includes an operation region D1 and a non-operation region D2. The organic encapsulation layer 107 is provided in the operation region D1 of the electronic device substrate 100 and extends to the non-operation region D2.

Figure 2A:
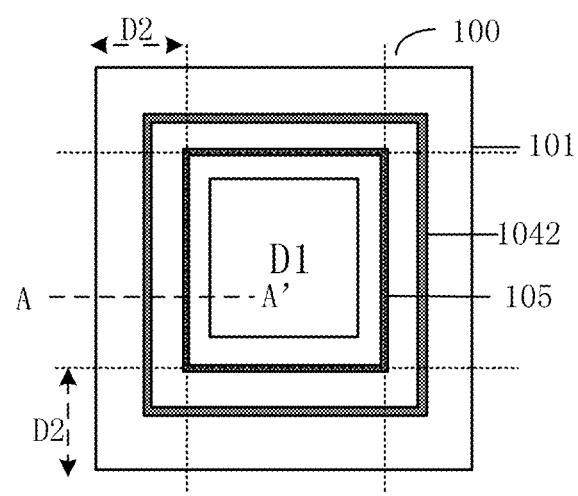
FIG. 2A is a schematic structural plan view of an electronic device substrate provided by at least one embodiment of the present disclosure.

As shown in FIG. 2A, a main surface (namely a surface facing the padding structure 105) of the base substrate 101 of the electronic device substrate 100 is rectangular. In other embodiments, the base substrate may also be in other shapes. For instance, a material of the base substrate 101 is a glass substrate, a quartz substrate, a plastic substrate or any other substrate of a suitable material.

As shown in FIGS. 2B to 3D, the organic encapsulation layer 107 is provided on the base substrate 101 and, for instance, includes the main part 1071 and the edge part 1072; the main part 1071 is provided in the operation region D1 of the electronic device substrate 100 and has a basically consistent thickness on the whole; the edge part 1072 is provided in the non-operation region D2 of the electronic device substrate 100 and at least partially covers the padding structure 105, and a thickness of the edge part 1072 gradually reduces in a direction away from the main part.

The electronic device substrate 100, for instance, is an organic light-emitting diode electronic device substrate. The organic light-emitting diode electronic device substrate generally includes organic light-emitter elements, driving circuits of the organic light-emitter elements, etc. Because the organic light-emitter elements are sensitive to water vapor and oxygen in the air, the thin-film encapsulation structure is usually required to encapsulate the light-emitter elements in the electronic device substrate, so as to prevent the external water vapor and oxygen from eroding the light-emitter elements in the electronic device substrate. The thin-film encapsulation structure, for instance, is a structure formed by multiple organic encapsulation layers and multiple inorganic encapsulation layers which are alternately stacked, in which the function of the organic encapsulation layer, for instance, is usually to provide planarization-thin-film deposition conditions and a good particulate coating effect for the subsequently formed inorganic encapsulation layer. On the other hand, the organic encapsulation layer usually has soft texture, and when the thin-film encapsulation structure including the organic encapsulation layers is applied to a display device, for instance, a flexible organic light-emitting diode display device, the structure is in line with the design tendency of the flexible display device.

In the embodiments of the present disclosure, the organic encapsulation layer 107, for instance, is formed by the inkjet printing process. Because the ink material for forming the organic encapsulation layer 107 usually have a certain degree of fluidity in the process of forming the organic encapsulation layer 107, for instance, a part of the ink material, usually overflow (namely towards the edge of the electronic device substrate) from the operation region D1 of the electronic device substrate 100 to a position on a side of the padding structure 105 close to the edge of the base substrate 101, thus the organic encapsulation layer 107 is formed with a slope part with gradually reduced thickness in the boundary region c which is included by the non-operation region D2 and is close to the operation region D1, and the slope part forms the edge part 1072 of the organic encapsulation layer 107.

Figure 2B:
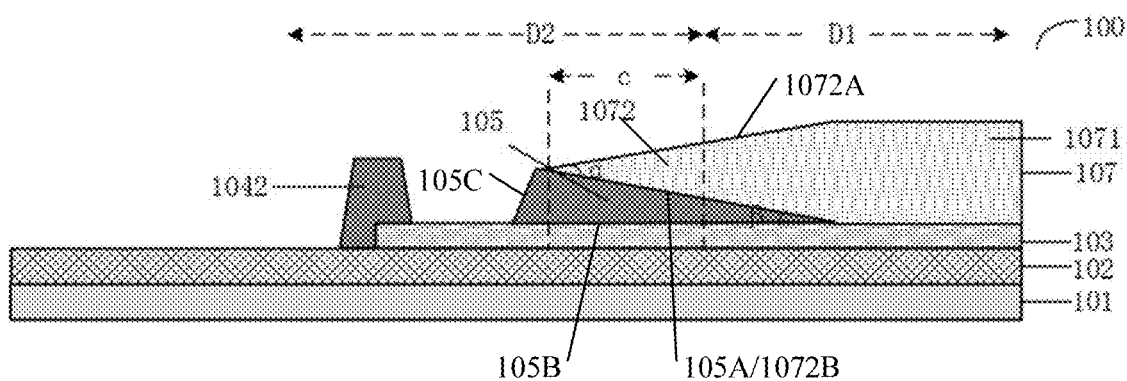
FIG. 2B is a schematic structural sectional view of the electronic device substrate in FIG. 2A along an A-A' line.

As shown in FIGS. 2B to 3D, a thickness of the main part 1071 of the organic encapsulation layer 107 is greater than a thickness of the edge part 1072 of the organic encapsulation layer 107. After the organic encapsulation layer 107 is formed on the base substrate 101, an included angle α is formed between an upper surface 1072A and a lower surface 1072B of the edge part 1072 of the organic encapsulation layer 107, for instance, the included angle α is formed at an edge of the edge part 1072 and between the upper surface 1072A of the edge part 1072 and a layer (for instance, the padding structure 105) which is provided below the edge part 1072 and is in contact with the edge part 1072, as shown in FIG. 2B. In the embodiments of the present disclosure, because the padding structure 105 is formed at first and then the organic encapsulation layer 107 is formed on the padding structure 105, the marked position of a in FIG. 2B is an included angle formed between the upper surface 1072A of the edge part 1072 of the organic encapsulation layer 107 and an inclined surface 105A (for instance, a wedge structure is formed by the inclined surface 105A and a lower surface 105B of the padding structure 105) which is included by the padding structure 105 and is close to the edge part 1072, and the size of the included angle depends on the properties of the material for forming the organic encapsulation layer and the properties of a surface material of a structure contacting the organic encapsulation layer (herein, referring to the surface material of the padding structure 105). The specific forming process of the organic encapsulation layer 107 will be described below in detail. The organic encapsulation layer 107, for instance, is formed of an acrylate material, an epoxy material or any other suitable organic material or at least one of these materials. No limitation will be given here in the embodiments of the present disclosure.

As shown in FIG. 2A to FIG. 3D, the padding structure 105 is provided on and protrudes from the base substrate 101 and encircles the operation region D1 of the electronic device substrate 100 to form an enclosed pattern; and the padding structure 105 may also at least partially have the function of the barrier wall and can be used for realizing the encapsulation function of the electronic device substrate. The embodiments of the present disclosure include but are not limited thereto. For instance, in another example of the embodiments of the present disclosure, the padding structure 105, for instance, encircles the operation region D1 of the electronic device substrate 100 to form a shape including an opening. In the process of forming the organic encapsulation layer 107, in order to avoid ink from being jagged at a boundary of the organic encapsulation layer 107 formed on the base substrate 101 or from going beyond a designated substrate range, in the embodiments of the present disclosure, for instance, the padding structure 105 is partially provided on the base substrate 101 at a position corresponding to the ink print boundary. The padding structure 105 is at least partially provided below the edge part 1072 of the organic encapsulation layer 107 and covered by the edge part 1072 of the organic encapsulation layer 107. With respect to the base substrate 101, the height of the part which is included by the padding structure 105 and is away from the main part 1071 of the organic encapsulation layer 107 is greater than the height of the another part which is included by the padding structure 105 and is close to the main part 1071 of the organic encapsulation layer 107, that is, in the direction from the non-operation region D2 of the electronic device substrate 100 to the operation region D1, the height of the padding structure 105 gradually reduces. For instance, the padding structure 105 forms the wedge structure, and the direction in which the height gradually reduces is an extension direction of the wedge structure. The padding structure 105, for instance, may be formed of an inorganic material, an organic material or any other suitable material or at least one of these materials. No limitation will be given here in the embodiments of the present disclosure.

By providing the padding structure 105 below the edge part 1072 of the organic encapsulation layer 107, the edge part 1072 of the organic encapsulation layer 107 can be elevated to a certain degree, so as to reduce the height difference between a surface of the main part 1071 of the organic encapsulation layer 107 and a surface of the edge part 1072 relative to the base substrate, and avoid different flow trends at different positions of the main part 1071 of the organic encapsulation layer 107, thereby improving the thickness uniformity of the organic encapsulation layer.

Figure 3A:
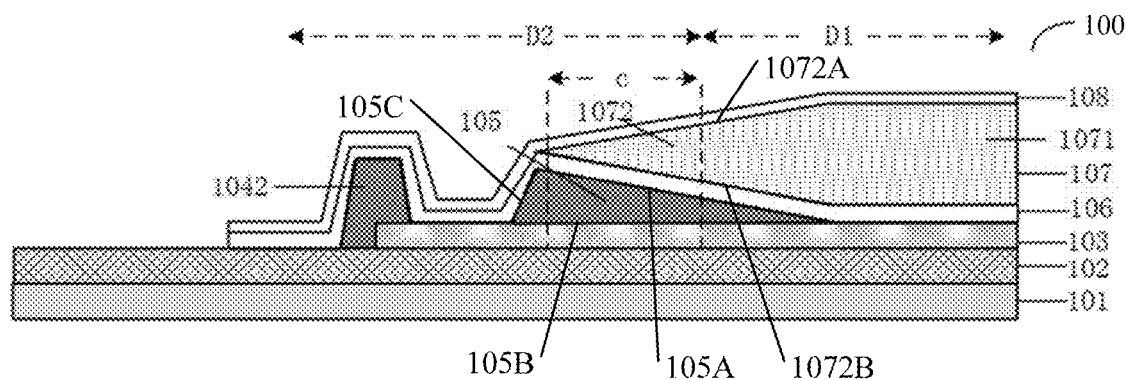
FIG. 3A is another schematic structural sectional view of the electronic device substrate provided by at least one embodiment of the present disclosure.
Figure 3B:
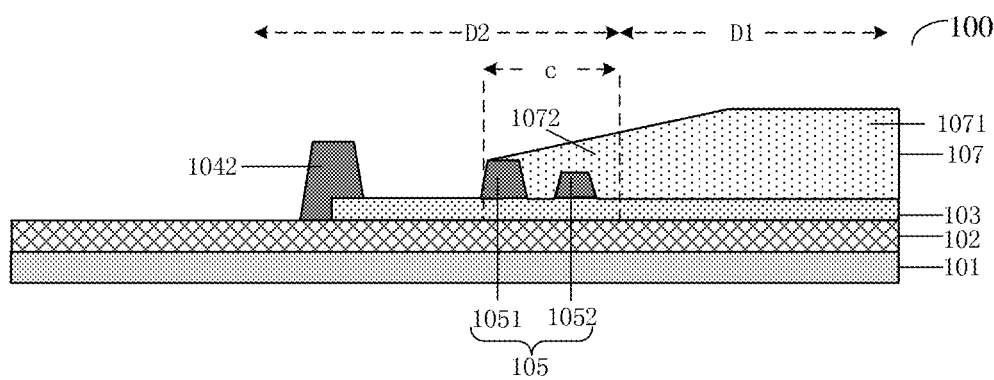
FIG. 3B is another schematic structural sectional view of the electronic device substrate provided by at least one embodiment of the present disclosure.
Figure 3C:
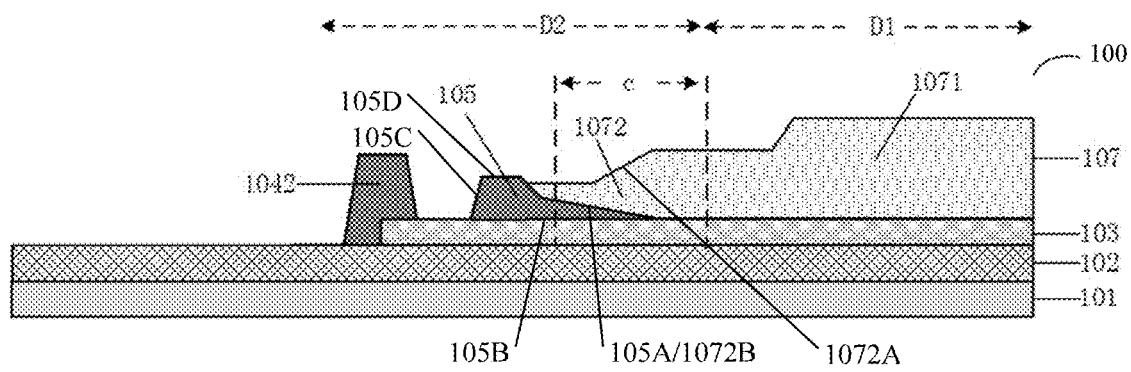
FIG. 3C is another schematic structural sectional view of the electronic device substrate provided by at least one embodiment of the present disclosure.

For instance, as shown in FIGS. 2B, 3A and 3C, the sectional structure of the padding structure 105 is wedge-shaped, and in this case, a wedge part of the padding structure 105 includes the inclined surface 105A inclined with respect to the upper surface of the base substrate 101. In other embodiments, the sectional structure of the padding structure 105 includes a plurality of protrusions spaced apart from each other (as shown in FIG. 3B) or is a step structure (as shown in FIG. 3D) or other structures.

Figure 3D:
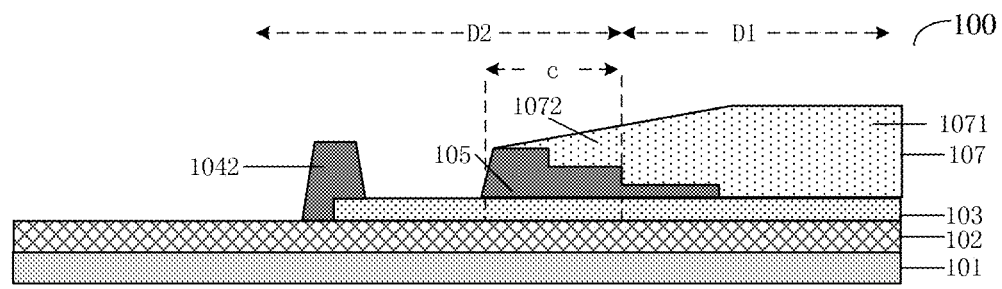
FIG. 3D is another schematic structural sectional view of the electronic device substrate provided by at least one embodiment of the present disclosure.

For instance, as shown in FIGS. 2B, 3B and 3D, the edge part 1072 of the organic encapsulation layer 107 is in direct contact with the padding structure 105. For instance, as shown in FIGS. 2B and 3C, the inclined surface 105A is in direct contact with a surface 1072B, which is included by the edge part 1072 of the organic encapsulation layer 107 and faces the padding structure 105. In other embodiments, the edge part 1072 of the organic encapsulation layer 107 does not directly contact the padding structure 105. For instance, as shown in FIG. 3A, the inclined surface 105A of the padding structure 105 is parallel to the surface 1072B of the edge part 1072 of the organic encapsulation layer 107.

For instance, as shown in FIGS. 2B, 3A and 3C, the padding structure 105 further includes another inclined surface 105C inclined with respect to the upper surface of the base substrate 101; an inclination direction of the another inclined surface 105C is opposite to an inclination direction of the inclined surface 105A of the wedge part; and an inclination degree of the another inclined surface 105C is greater than an inclination degree of the inclined surface 105A of the wedge part.

For instance, as shown in FIG. 3D, the padding structure 105 further includes a flat part; a surface 105D that is included by the flat part and is away from the base substrate 101 is parallel to the base substrate 101; and the flat part is provided on a side of the wedge part away from the organic encapsulation layer 107.

For instance, in one example, a slope angle β is formed between the base substrate 101 and the inclined surface 105A that is included by the padding structure 105 and is close to the organic encapsulation layer 107, and a shape and the slope angle β of the padding structure 105 are matched with a shape and the included angle α of the edge part 1072 of the organic encapsulation layer 107, so the shape of the padding structure 105 and the edge part 1072 of the organic encapsulation layer 107 become complementary, thereby reducing the included angle between the upper surface 1072A of the edge part 1072 and the base substrate 101. For instance, the slope angle β of the inclined surface of the padding structure 105 is equal to the included angle α of the organic encapsulation layer 107 so that the upper surface 1072A of the edge part 1072 can be parallel to the base substrate 101, or the slope angle β and the included angle α may also be unequal.

In a situation where the slope angle β formed by the inclined surface 105A of the padding structure 105 is equal to the included angle α formed between the surfaces of the organic encapsulation layer 107 (the included angle between the upper surface 1072A and the lower surface 1072B, adjacent to each other, of the edge part 1072), with respect to the base substrate 101, a height of the surface of the edge part 1072 of the organic encapsulation layer 107 with respect to the base substrate 101 is closer to a height of the surface of the main part 1071 of the organic encapsulation layer 107 with respect to the base substrate 101, so the thickness uniformity of the organic encapsulation layer 107 can be better.

For instance, in another example of the embodiments of the present disclosure, the electronic device substrate includes an inner barrier wall encircling the operation region and an outer barrier wall encircling the inner barrier wall. As shown in FIGS. 2B-3D, for instance, the padding structure 105 serves as the inner barrier wall; or the padding structure is provided on a side of the inner barrier wall close to the organic encapsulation layer, and the inner barrier wall is provided on and protrudes from the base substrate. In the process of forming the organic encapsulation layer 107, the organic encapsulation layer 107 formed by the ink on the base substrate 101 sometimes would be out of the designated base range, so for instance, the inner barrier wall is provided on the base substrate 101 at the position corresponding to the ink print boundary. At this point, the inner barrier wall is provided on a side of the padding structure 105 away from the organic encapsulation layer 107, and the padding structure 105 is provided on the side of the inner barrier wall close to the organic encapsulation layer 107, namely the padding structure 105 is provided between the inner barrier wall and the organic encapsulation layer 107. For instance, in the example as shown in the figures, the inclined surface (for instance, a surface adjacent to the organic encapsulation layer 107) that is included by the padding structure 105 and faces the organic encapsulation layer 107 is provided below the edge part 1072 of the organic encapsulation layer 107. For instance, in a situation where the padding structure 105 is provided between the inner barrier wall and the organic encapsulation layer 107, the height of the padding structure 105 with respect to the base substrate 101 is less than the height of the inner barrier wall with respect to the base substrate. For instance, in the direction from the non-operation region D2 of the electronic device substrate 100 to the operation region D1, the height of the padding structure 105 is gradually reduced to form the wedge structure. The padding structure 105 is at least partially provided below the edge part 1072 of the organic encapsulation layer 107 and covered by the edge part 1072 of the organic encapsulation layer 107, so as to elevate the edge part 1072 of the organic encapsulation layer 107 to a certain degree, reduce the height difference between the surface of the main part 1071 of the organic encapsulation layer 107 and the surface of the edge part 1072 with respect to the base substrate, and improve the thickness uniformity of the organic encapsulation layer. The inner barrier wall and the elevation part, for instance, may be formed of an inorganic material, an organic material or any other suitable material or at least one of these materials. No limitation will be given here in the embodiment of the present disclosure.

As shown in FIGS. 2A and 2B, the electronic device substrate 100, for instance, may further include a barrier wall 1042 (the barrier wall encircles the padding structure 105 and is the above outer barrier wall) and structures such as a buffer layer 102 and a back panel 103 which are provided between the padding structure 105 and the base substrate 101.

As shown in FIG. 2A to FIG. 3D, the barrier wall 1042 is provided on the base substrate 101; and the barrier wall 1042 is provided on a side of the padding structure 105 close to the edge of the base substrate 101, and there is an interval between the barrier wall and the padding structure 105. For instance, a bonding part and the like for bonding a cover plate and the electronic device substrate is formed at the interval. For instance, a width of the interval (namely the distance between the barrier wall 1042 and the padding structure 105) can be correspondingly adjusted according to the design requirements of products. No limitation will be given here in the embodiment of the present disclosure. As shown in FIG. 2A, the barrier wall 1042 encircles the padding structure 105 to form an enclosed pattern. The embodiments of the present disclosure include but are not limited thereto. For instance, in another example of the embodiments of the present disclosure, the barrier wall 1042 encircles the padding structure 105 to form a shape including an opening. With respect to the base substrate 101, the height of the barrier wall 1042 is, for instance, larger than the height of the padding structure 105, so as to better define the print region of the ink material and prevent the ink material for forming the organic encapsulation layer 107 from overflowing the boundary region. For instance, in a situation where the ink material overflows the padding structure 105 due to partial damage and collapse of the padding structure 105 under external pressure, because the height of the barrier wall 1042 is greater than the height of the padding structure 105, the ink material for forming the organic encapsulation layer 107 can be defined in corresponding region, so as to avoid the ink material from overflowing the designated region to result in the poor reliability of products. The material of the barrier wall 1042, for instance, may be the same or different from the material of the padding structure 105.

As shown in FIG. 2B to FIG. 3D, the buffer layer 102 is arranged on the base substrate 101 and provided between the base substrate 101 and the organic encapsulation layer 107. The buffer layer 102, for instance, can prevent external impurity ions, water vapor, oxygen and the like from penetrating into the base substrate 101 and being diffused into subsequently formed circuits such as organic light-emitter elements or thin film transistors, and then can avoid the erosion on the light-emitter elements, avoid the impact on the service life of the light-emitter elements, and avoid the impact on the characteristics such as the threshold voltage and the leakage current of the thin film transistor elements. Meanwhile, the buffer layer 103 can also planarize the surface of a part of the base substrate 101 provided in the operation region D1. The example of the material of the buffer layer 102 includes SiNx, SiOx or any other suitable material.

The back panel 103 is provided between the buffer layer 102 and the organic encapsulation layer 107. In the electronic device substrate, e.g., the organic light-emitting diode electronic device substrate, the back panel 103 may generally include structures such as organic light-emitter elements and driving circuits of the organic light-emitter elements. The driving circuits may include components such as thin film transistors and capacitors; circuit patterns in different layers, for instance, may be electrically connected via through holes; and an active layer of the thin film transistor, for instance, may be amorphous silicon, polysilicon, or oxide semiconductor, etc. The organic light-emitter elements are provided on the back panel 103 and usually arranged in the operation region D1 and covered by the organic encapsulation layer 107. The organic light-emitter element, for instance, may include a pixel electrode (for instance, a cathode or an anode), a counter electrode (correspondingly, for instance, an anode or a cathode), and a light-emitting layer provided between the pixel electrode and the counter electrode, and may also include auxiliary structures such as a pixel define layer. The light-emitting layer, for instance, may include an organic emission layer and moreover, may further include one or more of a hole transport layer, a hole injection layer, an electron transport layer and an electron injection layer. No limitation will be given here in the embodiment of the present disclosure.

In the electronic device substrate 100 provided by the embodiments of the present disclosure, by providing the padding structure 105 below the edge part 1072 of the organic encapsulation layer 107, the edge part 1072 of the organic encapsulation layer 107 can be elevated to a certain degree, so as to reduce the height difference between the main part 1071 and the edge part 1072 of the organic encapsulation layer 107 with respect to the base substrate. The arrangement of the padding structure 105 below the edge part 1072 improves the thickness uniformity of the organic encapsulation layer, improves the optical long-range uniformity of the electronic device substrate, and then improves the optical display effect of the electronic device substrate. Moreover, in the situation where the slope angle β formed by the inclined surface 105A of the padding structure 105 is equal to the included angle α at the edge position of the edge part 1072 of the organic encapsulation layer 107, the height of the upper surface of the edge part 1072 of the organic encapsulation layer 107 with respect to the base substrate 101 is closer to the height of the upper surface of the main part 1071 of the organic encapsulation layer 107 with respect to the base substrate 101, so as to obtain better thickness uniformity of the organic encapsulation layer 107, thereby further improving the optical long-range uniformity of the electronic device substrate and improving the optical display effect of the electronic device substrate.

FIG. 3A is a schematic structural sectional view of the electronic device substrate 100 in one example of at least one embodiment of the present disclosure. As shown in FIG. 3A, except the structure of the encapsulation thin film, the structure of the electronic device substrate in the example is basically the same with the structure of the electronic device substrate as described in FIG. 2B.

As shown in FIG. 3A, in the example, in addition to the organic encapsulation layer 107, the electronic device substrate 100, for instance, may further include a first encapsulation layer 106 and a second encapsulation layer 108. The first encapsulation layer 106 is provided between the organic encapsulation layer 107 and the base substrate 101 and covers the padding structure 105; and the second encapsulation layer 108 is provided on the organic encapsulation layer 107 and covers the padding structure 105.

For instance, the first encapsulation layer 106 is in direct contact with the padding structure 105 and is in direct contact with the organic encapsulation layer 7. For instance, the second encapsulation layer 108 is in direct contact with the organic encapsulation layer 107. For instance, parts which are respectively included by the first encapsulation layer 106 and the second encapsulation layer 108 and cover an outer inclined surface (for instance, the outer inclined surface is provided on the outside of the inclined surface 105A and has an inclination direction opposite to the inclination direction of the inclined surface 105A) of the padding structure 105 are in direct contact with each other. For instance, the first encapsulation layer 106 and the second encapsulation layer 108 also cover the barrier wall 1042, and another parts which are respectively included by the first encapsulation layer 106 and the second encapsulation layer 108 and cover the barrier wall 1042 are in direct contact with each other.

In the example, the first encapsulation layer 106 and the second encapsulation layer 108, for instance, may be an inorganic material layer; the example of the material for forming the first encapsulation layer 106 and/or the second encapsulation layer 108 includes silicon oxide, silicon nitride or any other suitable inorganic non-metallic material; and the first encapsulation layer 106 and/or the second encapsulation layer 108, for instance, may be formed by methods such as physical vapor deposition and chemical vapor deposition. Because the inorganic material usually has a tight molecular arrangement structure, it can effectively block external water vapor, oxygen, etc.

For instance, as shown in FIG. 3A, in the thin-film encapsulation structure of the electronic device substrate 100, an encapsulation film closest to the base substrate 101 and another encapsulation film farthest from the base substrate 101 are respectively the first encapsulation layer 106 and the second encapsulation layer 108, and the organic encapsulation layer 107 is provided between the first encapsulation layer 106 and the second encapsulation layer 108.

As for the thin-film encapsulation structure consist of the first encapsulation layer 106, the organic encapsulation layer 107 and the second encapsulation layer 108, in one aspect, the first encapsulation layer 106 and the second encapsulation layer 108, for instance, may be taken as the first line of defense of the electronic device substrate 200 against intrusion of water vapor and oxygen, and effectively improves the encapsulation effect of the thin-film encapsulation structure. In another aspect, the organic encapsulation layer 107 provided between the first encapsulation layer 106 and the second encapsulation layer 108, for instance, may have the function of planarizing the thin-film layer covered by the organic encapsulation layer, so as to reduce the step difference between the surfaces, and then the second encapsulation layer 108 covering the organic encapsulation layer 107 is uneasy to be damaged. In still another aspect, the organic encapsulation layer 107, for instance, may also extend a water and oxygen erosion path between the first encapsulation layer 106 and the second encapsulation layer 108 adjacent to the organic encapsulation layer 107. For instance, in a situation where there are cracks on the first encapsulation layer 106 and/or the second encapsulation layer 108, water vapor, oxygen or the like needs to pass through gaps of the first encapsulation layer 106/the second encapsulation layer 108 at first, then enters the organic encapsulation layer 107, and then has the possibility of entering into the gaps of the second encapsulation layer 108/the first encapsulation layer 106, thereby extending the water and oxygen erosion path between inorganic material layers adjacent to the organic encapsulation layer 107 such as the first encapsulation layer 106 and the second encapsulation layer 108, and further improving the encapsulation effect of the thin-film encapsulation structure.

FIG. 3B is a schematic structural sectional view of the electronic device substrate 100 in another example of at least one embodiment of the present disclosure. As shown in FIG. 3B, except the shape and the structure of the padding structure 105, the structure of the electronic device substrate of the example is basically the same with the structure of the electronic device substrate as described in FIG. 2B.

As shown in FIG. 3B, in the example, the padding structure 105 includes a first padding structure 1051 and a second padding structure 1052; the second padding structure 1052 is closer to the organic encapsulation layer 107 than the first padding structure 1051; there is an interval between the first padding structure 1051 and the second padding structure 1052; and the specific spacing distance can be correspondingly adjusted according to the design requirements of products, and no limitation will be given here in the example. A height of a top of the first padding structure 1051 with respect to the base substrate is greater than a height of a top of the second padding structure 1052 with respect to the base substrate. The edge part 1072 of the organic encapsulation layer 107 at least partially covers the padding structure 105. For instance, the edge part 1072 of the organic encapsulation layer 107 covers at least partial first padding structure 1051 (for instance, covering a top surface and an inner inclined surface of the first padding structure 1051 and not covering an outer inclined surface of the first padding structure 1051) and the entire second padding structure 1052.

For instance, the top of the first padding structure 1051 and the top of the second padding structure 1052 may be in various shapes such as plane or curved surface. As for the curved surface, for convenient comparison, the height of the top with respect to the base substrate may be defined as the maximum height of the curved surface.

The height difference between the first padding structure 1051 and the second padding structure 1052, for instance, may be correspondingly designed and adjusted according to the included angle α of the organic encapsulation layer 107 on the base substrate 101, so that the slope angle formed between the base substrate 101 and each of the first padding structure 1051 and the second padding structure 1052 can be close to or equal to the included angle α of the organic encapsulation layer 107 on the base substrate 101, thereby reducing the height difference between the main part 1071 and the edge part 1072 of the organic encapsulation layer 107 with respect to the base substrate, and consequently improving the thickness uniformity of the organic encapsulation layer and improving the optical long-range uniformity of the electronic device substrate.

It should be noted that: in the example, the number of the padding structures 105 as shown in FIG. 3B is two, but the embodiments of the present disclosure include but are not limited thereto. For instance, according to product design demands, the number of the padding structure 105 may be three or more. In the situation where a plurality of the padding structures 105 are provided, in the direction from the non-operation region D2 of the electronic device substrate 300 to the operation region D1, the heights of the plurality of padding structures 105 with respect to the base substrate 101 gradually reduce.

The first padding structure 1051 and/or the second padding structure 1052, for instance, may be formed of an inorganic material, an organic material or any other suitable material or at least one of these materials. No limitation will be given here in the embodiment of the present disclosure.

For instance, in another example, the first padding structure 1051 may be formed by the above inner barrier wall. For instance, the inner barrier wall serves as the first padding structure 1051. There is a certain interval between the inner barrier wall and the second padding structure 1052. The specific spacing distance can be correspondingly adjusted according to the design requirements of products. No limitation will be given here in the example. The inner barrier wall is provided on and protrudes from the base substrate 101 and encircles the operation region D1 of the electronic device substrate 300 to form the enclosed pattern. The examples include but are not limited thereto. For instance, in another example, the inner barrier wall encircles the operation region D1 of the electronic device substrate 300 to form the shape including an opening.

In the process of forming the organic encapsulation layer 107, in order to avoid the ink from being jagged at the boundary of the organic encapsulation layer 107 formed on the base substrate 101 or going beyond the specific substrate range, for instance, the inner barrier wall is provided on the base substrate 101 at the position corresponding to the ink print boundary. The second padding structure 1052 is provided on a side of the inner barrier wall close to the organic encapsulation layer 107, namely provided between the inner barrier wall and the organic encapsulation layer 107.

The height of the second padding structure 1052 with respect to the base substrate 101 is less than the height of the inner barrier wall with respect to the base substrate 101. The height difference between the inner barrier wall and the second padding structure 1052, for instance, may be correspondingly designed and adjusted according to the included angle α of the organic encapsulation layer 107 on the base substrate 101, so that at least one of the slope angle formed by the inner barrier wall with respect to the base substrate 101 and the slope angle formed by the second padding structure 1052 with respect to the base substrate 101 is close to or equal to the included angle α of the organic encapsulation layer 107 on the base substrate 101.

The inner barrier wall and/or the second padding structure 1052, for instance, may be formed of an inorganic material, an organic material or any other suitable material. No limitation will be given here in the embodiment of the present disclosure.

FIG. 3C is a schematic structural sectional view of the electronic device substrate 100 in still another example of the embodiments of the present disclosure. As shown in FIG. 3C, except the shape of the padding structure 105 and the shape of the organic encapsulation layer 107, the structure of the electronic device substrate in the example is basically the same with the structure of the electronic device substrate as described in FIG. 2B.

As shown in FIG. 3C, in the example, the padding structure 105 includes the flat part having a flat surface (the flat surface is roughly parallel to the base substrate 101) and the wedge part having the inclined surface, which protrude from the base substrate 101, and the flat part and the wedge part are connected with each other and form the padding structure 105 in a one-piece manner. The wedge part of the padding structure 105 is provided between the flat part of the padding structure 105 and the organic encapsulation layer 107. For instance, as shown in FIG. 3C, the wedge part of the padding structure 105 includes a lateral surface (namely the inclined surface 105A) that is included by the padding structure 105 and is close to the organic encapsulation layer 107. For instance, as shown in FIG. 3C, the inclined surface 105A has different inclination degrees, and an inclination degree of a lower part of the inclined surface 105A is less than an inclination degree of an upper part of the inclined surface 105A (the lower part is provided between the upper part and the operation region D1). A height of the wedge part of the padding structure 105 with respect to the base substrate 101 is less than a height of the flat part of the padding structure 105 with respect to the base substrate 101.

In other embodiments, the padding structure 105 may also be in other structural forms. For instance, in another example of the embodiments of the present disclosure, as shown in FIG. 3D, the padding structure 105 has the step structure. As shown in FIG. 3D, the padding structure 105 includes three connected plane parts (for instance, top surfaces of the three plane parts are parallel to the base substrate 101), and in the direction from the non-operation region D2 of the electronic device substrate 500 to the operation region D1, heights of the three plane parts of the padding structure 105 with respect to the base substrate 101 gradually reduce, so as to form the step structure. The number of the plane parts of the padding structure 105 includes but is not limited to three. For instance, the number of the plane parts of the padding structure 105 may be two or may also be more than three. No limitation will be given here in the example. The padding structure 105 is provided below the edge part 1072 of the organic encapsulation layer 107 and covered by the edge part 1072 of the organic encapsulation layer 107.

As shown in FIG. 3D, in the example, the pattern of the lower surface 1072B of the edge part 1072 of the organic encapsulation layer 107, for instance, is in a step shape having different heights due to the reasons such as the amount of liquid injected during inkjet printing, and the thickness of the main part 1071 of the organic encapsulation layer 107 is greater than the thickness of the edge part 1072. In the situation where the padding structure is provided below the edge part 1072 of the organic encapsulation layer 107, the height difference between the main part 1071 and the edge part 1072 of the organic encapsulation layer 107 with respect to the base substrate can be reduced, so the thickness uniformity of the organic encapsulation layer 107 can be improved, and then the optical long-range uniformity of the electronic device substrate 400 can be improved.

The embodiments of the present disclosure further provides a display device, which includes the foregoing electronic device substrate. The display device, for instance, may be a display device such as a liquid crystal display, an organic light-emitting diode display or an e-paper display or any product or component having a display function and including the display device such as a television, a digital camera, a mobile phone, a watch, a tablet computer, a notebook computer or a navigator. The technical effects of the display device may refer to the technical effects of the electronic device substrate as described in the above embodiments. No further description will be given here.

Another example of the embodiments of the present disclosure provides a light-emitting device, which includes the foregoing electronic device substrate. In this case, the electronic device substrate is a light-emitting substrate, so the light-emitting substrate also includes the above structures such as the organic encapsulation layer 107 and the padding structure 105.

At least one embodiment of the present disclosure provides a manufacturing method of the electronic device substrate. The manufacturing method of the electronic device substrate includes: providing the base substrate; forming the padding structure on the base substrate, so that the padding structure is provided on and protrudes from the base substrate; and forming the organic encapsulation layer on the base substrate, so that the organic encapsulation layer includes the edge part and the main part, and the edge part of the organic encapsulation layer at least partially covers the padding structure, and the part which is included by the padding structure and is away from the main part of the organic encapsulation layer has the height with respect to the base substrate greater than the height of the another part which is included by the padding structure and is close to the main part of the organic encapsulation layer with respect to the base substrate.

For instance, before forming the padding structure, an organic encapsulation test layer is formed on the base substrate, the organic encapsulation test layer includes a main part and an edge part, the main part of the organic encapsulation test layer is provided in a region where the main part of the organic encapsulation layer to be formed is located, the edge part of the organic encapsulation test layer is provided in a region where the edge part of the organic encapsulation layer to be formed is located; measuring an included angle formed between surfaces of the edge part of the organic encapsulation test layer; and removing the organic encapsulation test layer. In the method, the padding structure is formed according to the included angle formed between the surfaces of the edge part of the organic encapsulation test layer.

FIG. 4A to FIG. 4E are sectional views of the electronic device substrate provided by the embodiments of the present disclosure in the manufacturing process.

Figure 4A:
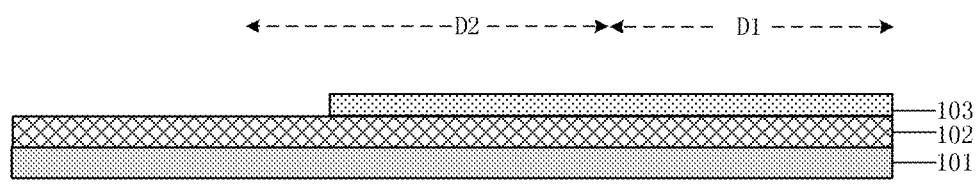
FIGS. 4A-4E are schematic structural sectional views illustrating a manufacturing processes of the electronic device substrate provided by at least one embodiment of the present disclosure.

As shown in FIG. 4A, the base substrate 101 is provided at first. The base substrate 101, for instance, may be a glass substrate, a quartz substrate, a plastic substrate or any other substrate of a suitable material.

For instance, the buffer layer 102 is formed on the base substrate 101. The buffer layer 102, for instance, can prevent external impurity ions, water vapor, oxygen and the like from penetrating into the base substrate 101 and then being diffused into subsequently formed circuits such as organic light-emitter elements or thin film transistors, and then can avoid the erosion on the light-emitter elements, avoid the impact on the service life of the light-emitter elements, and avoid the impact on the characteristics such as the threshold voltage and the leakage current of the thin film transistor elements. Meanwhile, the buffer layer 103 can also planarize the surface of the base substrate 101. The buffer layer 102, for instance, may be deposited by methods such as plasma enhanced chemical vapor deposition (PECVD) or atmospheric pressure CVD (APCVD). The example of the material of the buffer layer 102 includes SiNx, SiOx or any other suitable material.

As shown in FIG. 4A, the back panel 103 is formed on the buffer layer 102, and the example of the material of the back panel 103 includes a glass substrate, a quartz substrate, a plastic substrate or any other substrate of a suitable material. In the electronic device substrate such as the organic light-emitting diode electronic device substrate, the back panel 103 may generally include structures such as organic light-emitter elements and driving circuits of the organic light-emitter elements. The driving circuits may include components such as thin film transistors and capacitors. The organic light-emitter elements are provided on the back panel 103 and usually arranged in the operation region D1 and covered by the subsequently formed thin-film encapsulation structure. The organic light-emitter element, for instance, may include the pixel electrode (for instance, the cathode or the anode), the counter electrode (correspondingly, for instance, the anode or the cathode), and the light-emitting layer provided between the pixel electrode and the counter electrode, and may also include auxiliary structures such as the pixel definition layer. The light-emitting layer, for instance, may include the organic emission layer and moreover, may further include one or more of the hole transport layer, the hole injection layer, the electron transport layer and the electron injection layer. No limitation will be given here in the embodiment of the present disclosure. For instance, the conventional photolithography process may be adopted to pattern metal layers, insulating layers, semiconductor layers and the like to form the required thin film transistors and organic light-emitter elements. No further description will be given here.

Figure 4B:
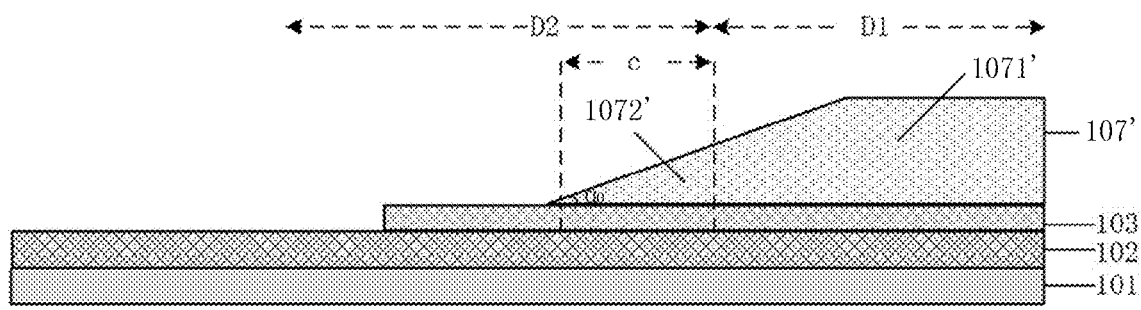

As shown in FIG. 4B, the organic encapsulation test layer 107' may be formed on a surface of the back panel 103 by the inkjet printing process after the steps of forming the back panel 103 and forming components such as the organic light-emitter elements and the thin film transistors on the back panel 103. Before the next manufacturing process, the following test is performed: testing the included angle $\alpha_0$ formed between the surfaces of the organic encapsulation test layer 107' and on the surface of the base substrate provided with the back panel 103. As described above, the included angle $\alpha_0$ is relevant to the characteristics of the material of the surface that is on the base substrate 101 and supports the organic encapsulation test layer 107'. For instance, in a situation where the organic encapsulation test layer 107' is directly formed on the surface of the back panel 103, the back panel 103 has the surface formed of an inorganic material, and the inorganic material and the organic encapsulation test layer 107' define the included angle $\alpha_0$. Moreover, for instance, in the case that the first encapsulation layer 106 is also formed on the surface of the back panel 103, the first encapsulation layer 106 and the organic encapsulation test layer 107' define the included angle $\alpha_0$. Therefore, the included angle $\alpha_0$ may be different in different conditions, so the height, the sectional shape and the like of the padding structure 105 need to be correspondingly adjusted according to actual design of products.

The specific test mode may simulate actual production scenes and, for instance, may adopt the following means: the organic encapsulation test layer 107' is formed in the designated region of the electronic device substrate by the inkjet printing method; because the ink material for forming the organic encapsulation test layer 107' generally has certain fluidity, in the process of forming the organic encapsulation test layer 107', a part of the ink material, for instance, generally and slowly flows from the operation region D1 of the electronic device substrate to the non-operation region D2, so the organic encapsulation test layer 107' forms a slope in the boundary region c close to the operation region D1, and the slope forms an edge part 1072' of the organic encapsulation test layer 107'. As shown in FIG. 4B, the formed organic encapsulation test layer 107' includes the main part 1071' and the edge part 1072'; the main part 1071' is at least partially provided in the operation region D1; the edge part 1072' is provided in the non-operation region D2; and the thickness of the main part 1071' of the formed organic encapsulation test layer 107' is greater than the thickness of the edge part 1072' of the organic encapsulation test layer 107'. An included angle is formed at an interface where the organic encapsulation test layer 107' contacts the back panel 103, and a as shown in FIG. 4B is the included angle of the organic encapsulation test layer 107' on the back panel 103. For instance, a wetting angle measuring meter may be adopted to measure the included angle formed between the surfaces of the organic encapsulation test layer 107' to obtain the value of the included angle $\alpha_0$, and the included angle $\alpha_0$ is an included angle of the organic encapsulation test layer 107' on the base substrate 101. In the embodiments of the present disclosure, the example of the material for forming the organic encapsulation test layer 107' includes an acrylate material, an epoxy material or any other suitable organic material. No limitation will be given here in the embodiments of the present disclosure.

Figure 4C:
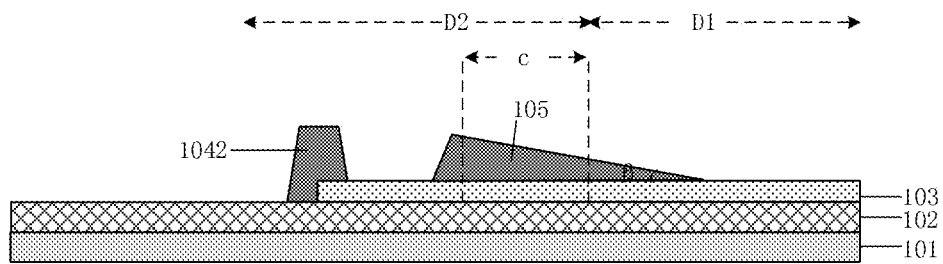

As shown in FIG. 4C, after obtaining the included angle $\alpha_0$ of the organic encapsulation test layer 107' on the base substrate 101 by the above method, the organic encapsulation test layer 107' is removed, and subsequently, the padding structure 105 and the barrier wall 1042 are formed, as shown in FIG. 4C, on the base substrate 101, the buffer layer 102 and the back panel 103 formed by the method as shown in FIG. 4A. The structural shape of the padding structure 105, for instance, may be the same with the condition described by any example of the above embodiments. Description is given in the embodiment of the present disclosure by taking the case that the padding structure 105 is formed in a one-piece manner as an example. The padding structure 105 is formed according to the included angle measured in the above test. For instance, the slope angle of the padding structure 105 is obtained according to the above included angle. For instance, the height of the padding structure 105 is obtained according to the above included angle.

As shown in FIG. 4C, for instance, the padding structure 105 and the barrier wall 1042 are formed via a half-tone mask. The half-tone mask is composed of a shielding part, a half-tone transmissive part and a fully transmissive part.

For instance, the step of forming the padding structure 105 and the barrier wall 1042 via the half-tone mask includes the following steps S41 to S43.

Step S41: forming a photoresist pattern on a thin-film layer for forming the padding structure 105 and the barrier wall 1042 via a positive photoresist, in which the photoresist pattern includes a first photoresist pattern, a second photoresist pattern and an opening part which have different thicknesses. In this case, the first photoresist pattern with a relatively large thickness overlaps the shielding part of the half-tone mask; the second photoresist pattern is thinner than the first photoresist pattern and overlaps the half-tone transmissive part of the half-tone mask; and the opening part overlaps the fully transmissive part of the half-tone mask. The photoresist pattern is taken as the mask to etch an exposure region (namely a region corresponding to the second photoresist pattern and the opening part of the photoresist pattern) of the thin-film layer for forming the padding structure 105 and the barrier wall 1042.

Step S42: by utilization of an ashing process of, for instance, oxygen plasma to reduce a thickness of the first photoresist pattern and meanwhile remove the second photoresist pattern, forming the padding structure 105 at a region of the thin-film layer corresponding to the second photoresist pattern, so that at least partial padding structure 105 is provided in the range of the boundary region c adjacent to the operation region D1. The height of the formed padding structure 105 with respect to the base substrate 101 is gradually reduced from the non-operation region D2 of the electronic device substrate to the operation region D1; the formed padding structure 105 has the wedge structure; and the formed inclined surface has the slope angle β. The slope angle β of the formed inclined surface of the padding structure 105 roughly matches with the obtained included angle $\alpha_0$ between the surfaces of the organic encapsulation test layer 107' as described above. For instance, α and β may be equal, or may also be unequal but close to each other.

Step S43: removing the remaining first photoresist pattern by a stripping process, to form the barrier wall 1042.

The formed barrier wall 1042 is provided on the side of the padding structure 105 close to the edge of the base substrate 101; there is an interval between the barrier wall and the padding structure 105; and the specific spacing distance, for instance, can be correspondingly adjusted according to the design requirements of products. No limitation will be given here in the embodiment of the present disclosure. The barrier wall 1042 encircles the padding structure 105 to form the enclosed pattern. The embodiments of the present disclosure include are but not limited thereto. For instance, in another example of the embodiments of the present disclosure, the barrier wall 1042 may encircle the padding structure 105 to form the shape including the opening. The height of the barrier wall 1042 with respect to the base substrate 101, for instance, may be generally greater than the height of the padding structure 105 with respect to the base substrate 101, so as to better prevent the the ink material for subsequently forming the organic encapsulation layer 107 from overflowing the designated region.

In the embodiments of the present disclosure, the example of the material for forming the padding structure 105 and the barrier wall 1042 includes an inorganic material, an organic material or any other suitable material. No limitation will be given here in the embodiment of the present disclosure.

Or, the padding structure 105 and the barrier wall 1042 may be formed of a photosensitive resin. By forming a photosensitive resin layer, exposing the photosensitive resin via a half-tone mask, and then performing development, the padding structure 105 and the barrier wall 1042 are obtained.

Figure 4D:
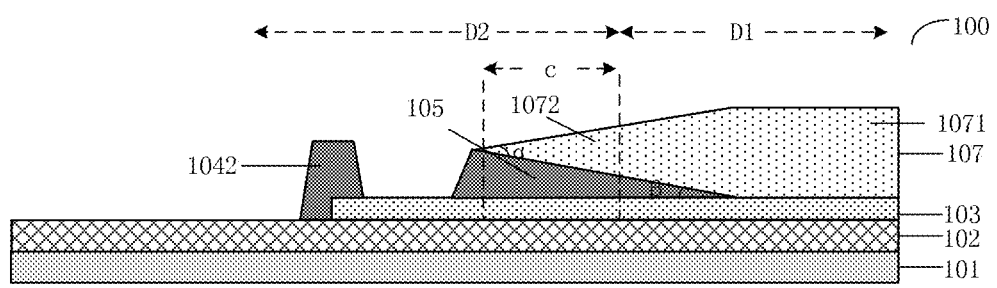

As shown in FIG. 4D, after the step of forming the padding structure 105, the organic encapsulation layer 107 is formed on the padding structure 105, and the method for forming the organic encapsulation layer 107, for instance, may adopt the inkjet printing method described above. Because the ink for forming the organic encapsulation layer 107 generally has a certain fluidity, in the process of forming the organic encapsulation layer 107, a part of the ink material, for instance, generally and slowly flows from the operation region D1 of the electronic device substrate to a position of the padding structure 105 close to the edge of the base substrate 101, so the organic encapsulation layer 107 forms the slope in the boundary region c close to the operation region D1, and the slope consists of the edge part 1072 of the organic encapsulation layer 107. As shown in FIG. 4D, the formed organic encapsulation layer 107 includes the main part 1071 and the edge part 1072; the main part 1071 is at least partially provided in the operation region D1; the edge part 1072 is provided in the non-operation region D2; and the thickness of the main part 1071 of the formed organic encapsulation layer 107 is greater than the thickness of the edge part 1072 of the organic encapsulation layer 107. At this point, the edge part 1072 covers the padding structure 105, and the slope angle β of the padding structure 105, for instance, is formed by matching with the included angle α of the organic encapsulation layer 107 measured in advance, so the padding structure 105 arranged below can elevate the height of the edge part 1072 of the organic encapsulation layer 107 with respect to the base substrate 101 to a certain degree, so as to reduce the height difference between the edge part 1072 and the main part 1071 with respect to the base substrate, thereby improving the thickness uniformity of the organic encapsulation layer 107, improving the optical long-range uniformity of the electronic device substrate, and improving the optical display effect of the electronic device substrate.

Figure 4E:
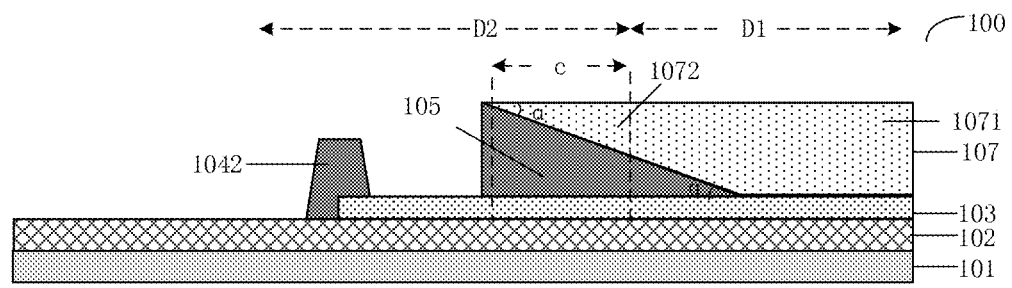

As shown in FIG. 4E, in the situation where the slope angle β of the inclined surface of the padding structure 105 formed according to the included angle $\alpha_0$ of the organic encapsulation test layer 107' measured in advance is equal to the included angle α of the organic encapsulation layer 107 (for instance, the included angle α of the organic encapsulation layer 107 is equal to the included angle $α_0$ of the organic encapsulation test layer 107' measured in advance), the surface height of the edge part 1072 of the organic encapsulation layer 107 with respect to the base substrate 101 is closer to the surface height of the main part 1071 of the organic encapsulation layer 107 with respect to the base substrate 101, so as to obtain better thickness uniformity of the organic encapsulation layer 107, thereby further improving the optical long-range uniformity of the electronic device substrate and improving the optical display effect of the electronic device substrate.

It should be noted that: in the embodiments of the present disclosure, as shown in FIG. 4E, the encapsulation structure of the electronic device substrate only includes the organic encapsulation layer 107, but the embodiments of the present disclosure are not limited thereto. For instance, in another example of the embodiments of the present disclosure, the encapsulation structure of the electronic device substrate further includes inorganic encapsulation layers (for instance, the first encapsulation layer and the second encapsulation layer), in which the inorganic encapsulation layers and the organic encapsulation layer are alternately stacked to form the encapsulation structure.

In another example of the embodiments of the present disclosure, the same method may be also adopted to manufacture the light-emitting substrate of the light-emitting device. Specific illustrative operations will not be described again.

It should be noted that: for clarity, not all the structures of the electronic device substrate have been given in the embodiments of the present disclosure and the accompanying drawings thereof; and in order to realize necessary functions of the electronic device substrate, the light-emitting substrate and the like, other structures not shown can be arranged by those skilled in the art according to specific application scenes, and no limitation will be given here in the embodiments of the present disclosure.

The various embodiments of the present disclosure and the features of the embodiments can be combined with each other to obtain a new embodiment without conflict.

What are described above is related to the illustrative embodiments of the disclosure only and not limitative to the scope of the disclosure; the scopes of the disclosure are defined by the accompanying claims.

What is claimed is:

1. An electronic device substrate, comprising:
a base substrate;
an organic encapsulation layer being on the base substrate and comprising a main part and an edge part; and
a padding structure being provided on the base substrate and protruding from the base substrate, wherein
the edge part of the organic encapsulation layer at least partially covers the padding structure; and a part that is comprised by the padding structure and is away from the main part of the organic encapsulation layer has a height with respect to the base substrate greater than a height of another part that is comprised by the padding structure and is close to the main part of the organic encapsulation layer with respect to the base substrate;
the electronic device substrate further comprises a barrier wall, the barrier wall is on the base substrate and on a side of the padding structure close to an edge of the base substrate, an interval is between the barrier wall and the padding structure, a height of the barrier wall with respect to the base substrate is greater than a height of the padding structure with respect to the base substrate, and the organic encapsulation layer does not cover the barrier wall;
a side of the padding structure away from the barrier wall has a step structure, the step structure includes multiple connected plane parts, top surfaces of the multiple plane parts are parallel to the base substrate; and in a direction toward the barrier wall, heights of the multiple plane parts of the step structure with respect to the base substrate gradually increase; and
a side of the padding structure facing the barrier wall is inclined with respect to the base substrate and is not step-like.

2. The electronic device substrate according to claim 1, wherein the electronic device structure comprises an operation region and a non-operation region; the main part of the organic encapsulation layer is in the operation region; and the edge part of the organic encapsulation layer is in the non-operation region.

3. The electronic device substrate according to claim 1, wherein in a direction perpendicular to the base substrate, a thickness of the edge part of the organic encapsulation layer is less than a thickness of the main part of the organic encapsulation layer.

4. The electronic device substrate according to claim 1, further comprising a first encapsulation layer, wherein the first encapsulation layer is between the organic encapsulation layer and the base substrate and covers the padding structure.

5. The electronic device substrate according to claim 4, further comprising a second encapsulation layer, wherein the second encapsulation layer is on the organic encapsulation layer and covers the padding structure.

6. The electronic device substrate according to claim 5, wherein each of the first encapsulation layer and the second encapsulation layer is an inorganic material layer.

7. The electronic device substrate according to claim 1, wherein the padding structure is in direct contact with the edge part.

8. A display device, comprising the electronic device substrate according to claim 1.

9. A manufacturing method of an electronic device substrate, comprising:
providing a base substrate;
forming a padding structure on the base substrate, wherein the padding structure is on the base substrate and protrudes from the base substrate; and
forming an organic encapsulation layer on the base substrate, wherein the organic encapsulation layer comprises an edge part and a main part, wherein
the edge part of the organic encapsulation layer at least partially covers the padding structure; and with respect to the base substrate, a part that is comprised by the padding structure and is away from the main part of the organic encapsulation layer has a height greater than a height of another part that is comprised by the padding structure and is close to the main part of the organic encapsulation layer;
the electronic device substrate further comprises a barrier wall, the barrier wall is on the base substrate and on a side of the padding structure close to an edge of the base substrate, an interval is between the barrier wall and the padding structure, a height of the barrier wall with respect to the base substrate is greater than a height of the padding structure with respect to the base substrate, and the organic encapsulation layer does not cover the barrier wall;

a side of the padding structure away from the barrier wall has a step structure, the step structure includes multiple connected plane parts, top surfaces of the multiple plane parts are parallel to the base substrate; and in a direction toward the barrier wall, heights of the multiple plane parts of the step structure with respect to the base substrate gradually increase; and a side of the padding structure facing the barrier wall is inclined with respect to the base substrate and is not step-like.

10. The method according to claim 9, further comprising:

forming an organic encapsulation test layer on the base substrate before forming the padding structure, wherein the organic encapsulation test layer comprises a main part and an edge part, the main part of the organic encapsulation test layer is in a region where the main part of the organic encapsulation layer to be formed is located, the edge part of the organic encapsulation test layer is in a region where the edge part of the organic encapsulation layer to be formed is located;

measuring an included angle formed between surfaces of the edge part of the organic encapsulation test layer; and removing the organic encapsulation test layer, wherein the padding structure is formed according to the included angle formed by the edge part of the organic encapsulation test layer.

11. The method according to claim 9, wherein the organic encapsulation layer is formed by an inkjet printing process.

12. A manufacturing method of an electronic device substrate, comprising:

providing a base substrate;

forming a padding structure on the base substrate, wherein the padding structure is on the base substrate and protrudes from the base substrate; and forming an organic encapsulation layer on the base substrate, wherein the organic encapsulation layer comprises an edge part and a main part, wherein the edge part of the organic encapsulation layer at least partially covers the padding structure; and with respect to the base substrate, a part that is comprised by the padding structure and is away from the main part of the organic encapsulation layer has a height greater than a height of another part that is comprised by the padding structure and is close to the main part of the organic encapsulation layer;

the method further comprises:

forming an organic encapsulation test layer on the base substrate before forming the padding structure, wherein the organic encapsulation test layer comprises a main part and an edge part, the main part of the organic encapsulation test layer is in a region where the main part of the organic encapsulation layer to be formed is located, the edge part of the organic encapsulation test layer is in a region where the edge part of the organic encapsulation layer to be formed is located;

measuring an included angle formed between surfaces of the edge part of the organic encapsulation test layer; and removing the organic encapsulation test layer, and the padding structure is formed according to the included angle formed by the edge part of the organic encapsulation test layer.

\* \* \* \* \*